US007909934B2

(12) United States Patent
Boyd et al.

(10) Patent No.: US 7,909,934 B2
(45) Date of Patent: *Mar. 22, 2011

(54) MEGASONIC CLEANING EFFICIENCY USING AUTO-TUNING OF A RF GENERATOR AT CONSTANT MAXIMUM EFFICIENCY

(75) Inventors: John Boyd, Ottawa (CA); Andras Kuthi, Thousand Oaks, CA (US); Michael G. R. Smith, San Ramon (GB); Thomas W. Anderson, Hayward, CA (US); William Thie, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 1471 days.

This patent is subject to a terminal disclaimer.

(21) Appl. No.: 11/217,523

(22) Filed: Aug. 31, 2005

(65) Prior Publication Data
US 2006/0000487 A1    Jan. 5, 2006

Related U.S. Application Data

(62) Division of application No. 10/360,322, filed on Feb. 6, 2003, now Pat. No. 6,995,067.

(51) Int. Cl.
*B08B 7/00* (2006.01)
*B08B 7/04* (2006.01)
(52) U.S. Cl. .................. 134/1.3; 134/1; 134/18; 134/32; 134/33; 134/184; 134/902
(58) Field of Classification Search ............... 134/1, 1.3, 134/18, 32, 33, 184, 902
See application file for complete search history.

(56) References Cited

U.S. PATENT DOCUMENTS

| 6,995,067 | B2 * | 2/2006 | Boyd et al. .............. 438/308 |
| 2004/0154637 | A1 * | 8/2004 | Boyd et al. .............. 134/1.3 |
| 2004/0157348 | A1 * | 8/2004 | Anderson et al. ......... 438/10 |
| 2006/0000487 | A1 * | 1/2006 | Boyd et al. .............. 134/1 |

* cited by examiner

*Primary Examiner* — Alexander Markoff
(74) *Attorney, Agent, or Firm* — Martine Penilla & Gencarella, LLP

(57) ABSTRACT

A system and method of cleaning a substrate includes a megasonic chamber that includes a transducer and a substrate. The transducer is being oriented toward the substrate. A variable distance d separates the transducer and the substrate. The system also includes a dynamically adjustable RF generator that has an output coupled to the transducer.

11 Claims, 15 Drawing Sheets

MEGASONIC CLEANING EFFICIENCY USING AUTO-TUNING OF A RF GENERATOR AT CONSTANT MAXIMUM EFFICIENCY

CROSS REFERENCE TO RELATED APPLICATIONS

This application is a divisional of claims priority from U.S. patent application Ser. No. 10/360,322 filed on Feb. 6, 2003 and issued as U.S. Pat. No. 6,995,067 on Feb. 7, 2006, and entitled "Improved Megasonic Cleaning Efficiency Using Auto-Tuning of an RF Generator at Constant Maximum Efficiency," which is incorporated herein by reference in its entirety.

BACKGROUND OF THE INVENTION

1. Field of the Invention

The present invention relates generally to systems and methods of tuning an RF generator, and more particularly, to methods and systems for automatically tuning an RF generator for a substrate cleaning system.

2. Description of the Related Art

The use of acoustic energy is a highly advanced, non-contact, cleaning technology for removing small-particles from substrates such as semiconductor wafers in various states of fabrication, flat panel displays, micro-electro-mechanical systems (MEMS), micro-opto-electro-mechanical systems (MOEMS), and the like. The cleaning process typically involves the propagation of acoustic energy through a liquid medium to remove particles from, and clean, a surface of a substrate. The megasonic energy is typically propagated in a frequency range of about 700 kHz (0.7 Megahertz (MHz)) to about 1.0 MHz, inclusive. The liquid medium can be deionized water or any one or more of several substrate cleaning chemicals and combinations thereof. The propagation of acoustic energy through a liquid medium achieves non-contact substrate cleaning chiefly through the formation and collapse of bubbles from dissolved gases in the liquid medium, herein referred to as cavitation, microstreaming, and chemical reaction enhancement when chemicals are used as the liquid medium through improved mass transport, or providing activation energy to facilitate the chemical reactions.

FIG. 1A is a diagram of a typical batch substrate cleaning system 10. FIG. 1B is a top view of the batch substrate cleaning system 10. A tank 11 is filled with a cleaning solution 16 such as deionized water or other substrate cleaning chemicals. A substrate carrier 12, typically a cassette of substrates, holds a batch of substrates 14 to be cleaned. One or more transducers 18A, 18B, 18C generate the emitted acoustic energy 15 that is propagated through the cleaning solution 16. The relative location and distance between the substrates 14 and the transducers 18A, 18B and 18C are typically approximately constant from one batch of substrates 14 to another through use of locating fixtures 19A, 19B that contact and locate the carrier 12.

The emitted energy 15, with or without appropriate chemistry to control particle re-adhesion, achieves substrate cleaning through cavitation, acoustic streaming, and enhanced mass transport if cleaning chemicals are used. A batch substrate cleaning process typically requires lengthy processing times, and also can consume excessive volumes of cleaning chemicals 16. Additionally, consistency and substrate-to-substrate control are difficult to achieve. Such conditions as "shadowing" and "hot spots" are common in batch, and other, substrate megasonic processes. Shadowing occurs due to reflection and/or constructive and destructive interference of emitted energy 15, and is compounded with the additional substrate surface area of multiple substrates 14, walls of the process tank etc. The occurrence of hot spots, primarily the result of constructive interference due to the use of multiple transducers and to reflection, can also increase with additional multiple-substrate surface areas. These issues problems are typically addressed by depending on the averaging effects of the multiple reflections of the acoustic energy on the substrate, which can lead to a lower average power to the substrate surfaces. To compensate for the lower average power, and provide effective cleaning and particle removal, power to the transducers is increased, thereby increasing the emitted energy 15 and increasing cavitation and acoustic streaming, which thereby increases the cleaning effectiveness. Additionally, pulsing the multiple transducer arrays 18A, 18B and 18C is used (i.e. providing a duty cycle such as turning the transducers on for 20 ms, and then off for 10 ms. The transducers 18A, 18B and 18C can also be operated out of phase (e.g., activated sequentially) to reduce compound reflections and interference.

FIG. 1C is a prior art, schematic 30 of an RF supply to supply one or more of the transducers 18A, 18B, 18C. An adjustable voltage controlled oscillator (VCO) 32 outputs a signal 33, at a selected frequency, to an RF generator 34. The RF generator 34 amplifies the signal 33 to produce a signal 35 with an increased power. The signal 35 is output to the transducer 18B. A power sensor 36 monitors the signal 35. The transducer 18B outputs emitted energy 15.

The precise impedance of the transducer 18B can vary depending on many variables such as the number, size and spacing of substrates 14 in the carrier 12 and the distance between the substrates 14 and the transducer 18B. The precise impedance of the transducer 18B can also vary as the transducer 18B ages through repeated usage. By way of example, if signals 33, 35 have a frequency of about 1 MHz, the wavelength is about 1.5 mm (0.060 inches) in a deionized water medium such as the cleaning solution 16. As a result, referring again to FIG. 1A, if the location of the substrates 14 and carrier 12 is off by as little as about 0.5 mm (0.020 inches) or even less, the impedance of the transducer 18B can vary substantially.

Adjusting the frequency of the VCO can adjust the impedance of the transducer 18B by varying the frequency and therefore the wavelength of the signals 33, 35 and the emitted energy 15. Typically, a carrier 12 that is loaded with substrates 14 is placed in the tank 11 and the VCO 32 is adjusted to change the frequency of the signals 33, 35 and the emitted energy 15 until the impedance of the transducer 18B is matched, as indicated by a minimum value of a reflected signal 38 that is detected by the power meter 36. Once the VCO 32 has been adjusted to achieve the minimum reflected signal 38, the VCO 32 is typically not adjusted again unless significant repairs or maintenance are performed on the substrate cleaning system 10.

When the transducer 18B impedance is not matched, a portion of the emitted energy 17 (i.e., waves) emitted from the transducer 18B is reflected back toward the transducer 18B. On the surface of the transducer 18B, the reflected energy 17 can interfere with the emitted energy 15 causing constructive and destructive interference. The destructive interference reduces the effective cleaning power of the emitted energy 15 because a portion of the emitted energy 15 is effectively cancelled out by the reflected energy 17. As a result, the RF generator 34 efficiency is reduced.

The constructive interference can cause excess energy that can cause hot spots on the surfaces of the substrates 14 being cleaned. The hot spots can exceed an energy threshold of the substrates 14 and can damage the substrates 14. FIG. 1D is a typical transducer 18B. FIG. 1E is a graph 100 of the energy distribution across the transducer 18B. Curve 102 is a curve of the energy emitted across the transducer 18B in the x-axis. Curve 104 is a curve of the energy emitted across the transducer 18B in the y-axis. Curve 120 is a curve of the composite energy emitted across the transducer 18B in both the x-axis and the y-axis. The composite energy emitted across the transducer 18B in both the x-axis and the y-axis typically can vary between curve 120 and curve 122 as the known variations (e.g., location of the substrates, aging of the transducer, and wobble of a rotating substrate relative to the transducer etc.) cause the impedance of the transducer 18B to vary. A threshold energy level T is the damage threshold to the substrate(s) 14. Typically, the maximum power of the RF signal 35 and the resulting emitted energy 15 output by the transducer 18B is reduced to a level such that the maximum constructive interference results in a peak magnitude (i.e., peaks in curve 120) of less than the energy threshold T of the substrates 14 so as to prevent damage to the substrate 14. However, the reduced power of the RF signal 35 and the emitted energy 15 increases the cleaning process time required to achieve the desired cleaning result. In some instances, the reduced power of the signal 35 and the emitted energy 15 is insufficient to remove the some of the targeted particles from the substrates 14. As shown, the effective emitted energy can vary to a much lower level (represented by valleys in curve 122) such that the effectiveness of the cleaning process is severely impacted because the effective energy is so low (about 3) and therefore results in an energy window that extends from about 3 to about 17 as shown on the energy scale.

The transducer 18B is typically a piezoelectric device such as a crystal. The constructive and destructive interference caused by the reflected energy 17 can also impart a force to the surface of the transducer 18B sufficient to cause the transducer 18B to produce a corresponding reflected signal 38. The power sensor 36 can detect the reflected signal 38 that is reflected from the transducer 18B toward the RF generator 34. The reflected signal 38 can constructively or destructively interfere with the signal 35 output from the RF generator 34 to further reduce the efficiency of the RF generator 34.

In view of the foregoing, there is a need for an improved megasonic cleaning system that provides increased efficiency of the RF generator and a reduced energy window of the emitted acoustic energy and reduces the probability of substrate damage.

SUMMARY OF THE INVENTION

Broadly speaking, the present invention fills these needs by providing a dynamically cleaning system that uses an automatically tuned RF generator that is constantly tuned to the maintain resonance of the transducer and the emitted energy from the transducer. It should be appreciated that the present invention can be implemented in numerous ways, including as a process, an apparatus, a system, computer readable media, or a device. Several inventive embodiments of the present invention are described below.

One embodiment includes a method of cleaning a substrate that includes applying an RF signal at a frequency f to a transducer. The transducer being oriented toward the substrate such that the transducer emits an acoustic energy at the frequency f toward the substrate. The substrate is moved relative to the transducer. The RF signal is dynamically adjusted to maintain a resonance of the acoustic energy.

Dynamically adjusting frequency f can include automatically adjusting the frequency f for each cycle of the RF signal.

Moving the substrate relative to the transducer can include rotating the substrate.

The substrate can also be submerged in a cleaning solution. The cleaning solution can be deionized water. The cleaning solution can include one or more of a plurality of cleaning chemicals.

Dynamically adjusting the RF signal to maintain the resonance of the acoustic energy can include maintaining a constant voltage of the RF signal applied to the transducer.

An RF generator can apply the RF signal to the transducer and maintaining a constant voltage of the RF signal applied to the transducer can include measuring a first voltage of the RF signal, comparing the first voltage to a desired set point voltage, and inputting a control signal to a variable DC power supply so as to adjust an output voltage of the variable DC power supply, the variable DC power supply supplying DC power to the RF generator.

Dynamically adjusting the RF signal to maintain the resonance of the acoustic energy can include dynamically adjusting a frequency f of the RF signal applied to the transducer.

An RF generator can apply the RF signal to the transducer and dynamically adjusting the frequency f of the RF signal applied to the transducer can include measuring a supply voltage applied to the RF generator, measuring a peak voltage across an output amplifier included in the RF generator, producing a frequency control signal when the peak voltage is not equal to a selected ratio of the supply voltage, and applying the frequency control signal to a frequency control input of an oscillator that generates the RF signal.

An RF generator can apply the RF signal to the transducer and dynamically adjusting the frequency f of the RF signal applied to the transducer can include inputting an RF input signal from an oscillator the RF generator and amplifying the RF signal in the RF generator. A first phase of an input voltage of the RF input signal is measured, a second phase of a voltage of the RF signal output from the RF generator is measured. A frequency control signal is produced when the first phase is not equal to the second phase. The frequency control signal is applied to a frequency control input of the oscillator.

Another embodiment includes a system for cleaning a substrate includes a cleaning chamber that includes a transducer and a substrate. The transducer being oriented toward the substrate. A variable distance d separates the transducer and the substrate. The system also includes a dynamically adjustable RF generator that has an output coupled to the transducer and a feedback circuit coupled to a control input of the adjustable RF generator.

The substrate can be rotated. The distance d can vary about ½ wavelength of an RF signal output from the RF generator as the substrate is rotated.

The dynamically adjustable RF generator can include a variable DC power supply having a control input and a DC output coupled to the RF generator. The feedback circuit can include a first comparator that includes a first input coupled to a set point control signal, a second input coupled to the RF generator RF output, and a control signal output coupled to the control input of the adjustable RF generator. The control input includes a voltage control input on the variable DC power supply.

The dynamically adjustable RF generator can include an oscillator, an output amplifier coupled to the oscillator output and a load network. The oscillator has a control signal input and an RF signal output. The load network coupled between an output of the output amplifier and the output of the RF generator. The feedback circuit can include a peak voltage detector, and a second comparator. The peak voltage detector can be coupled across the output amplifier. The second comparator includes a third input coupled to an output of the variable DC power supply, a fourth input coupled to an output of the peak voltage detector, and a second comparator output coupled to the control input of the adjustable RF generator. The control input can include the oscillator control signal input.

The dynamically adjustable RF generator can include an oscillator and an RF generator input coupled to the oscillator RF signal output. The oscillator having a frequency control input and an RF signal output. The feedback circuit can include a voltage phase detector. The voltage phase detector can include a first phase input coupled to the RF signal output of the oscillator, a second phase input coupled to the RF generator output, and a frequency control signal output coupled to the control input of the adjustable RF generator. The control input can include the oscillator frequency control voltage input.

The dynamically adjustable RF generator can include a supply voltage source, an oscillator having a control signal input and an RF signal output, an output amplifier coupled to the oscillator output, a load network coupled between an output of the output amplifier and the output of the RF generator. The feedback circuit can include a peak voltage detector coupled across the output amplifier, and a comparator circuit. The comparator circuit can include a first input coupled to the supply voltage source, a second input coupled to an output of the peak voltage detector, and a comparator output coupled to the control input of the adjustable RF generator. The control input can include the oscillator control signal input.

The dynamically adjustable RF generator can include an oscillator, an RF generator input coupled to the oscillator RF signal output, and the feedback circuit can include a voltage phase detector. The oscillator has a frequency control input and an RF signal output. The voltage phase detector that includes a first phase input coupled to the RF signal output of the oscillator, a second phase input coupled to the RF generator output, and a frequency control signal output coupled to the control input of the adjustable RF generator. The control input can include the oscillator frequency control voltage input.

The transducer can include two or more transducers. The dynamically adjustable RF generator can include two or more dynamically adjustable RF generators each having a respective output coupled to one of the two or more transducers.

The transducer can include a first transducer oriented toward an active surface of the substrate and a second transducer oriented toward a non-active side of the substrate.

The present invention provides the advantage of significantly reduced cleaning processing time because the higher power acoustic energy can be used without damaging the substrate being cleaned.

The present invention also reduces the number of substrates damaged due to excess acoustic energy being applied to the substrate.

The auto-tuned RF generator also automatically adjusts for process-induced impedance changes such as different cleaning chemistries, different locations of the substrate, different process tank configurations etc, thereby providing a more flexible and robust cleaning process.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an acoustic energy cleaning system that automatically adjusts RF signal applied to the transducer for maximum efficiency will now be described. It will be apparent to those skilled in the art that the present invention may be practiced without some or all of the specific details set forth herein.

As described above, it is very important to increase the cleaning effectiveness, efficiencies and throughput rate of substrate cleaning systems, while reducing probability of damage to the substrate. These requirements are exacerbated by the continuously shrinking device sizes and the fact that many cleaning systems are evolving to single substrate cleaning systems.

Figure 1B:
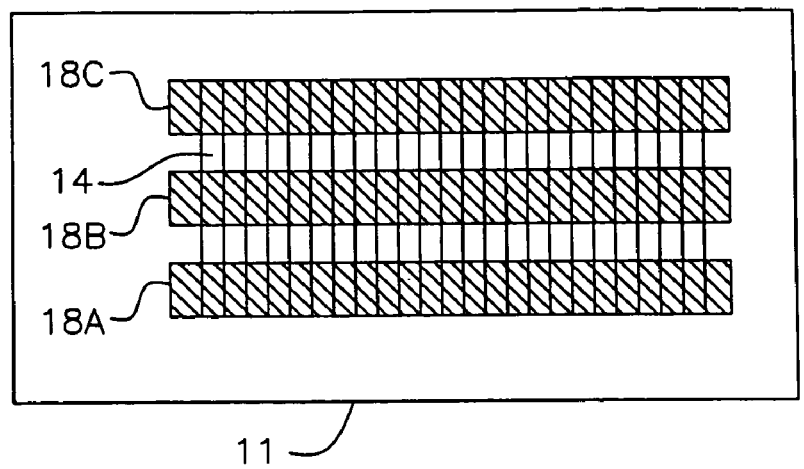
FIG. 1B is a top view of the batch substrate cleaning system.
Figure 1A:
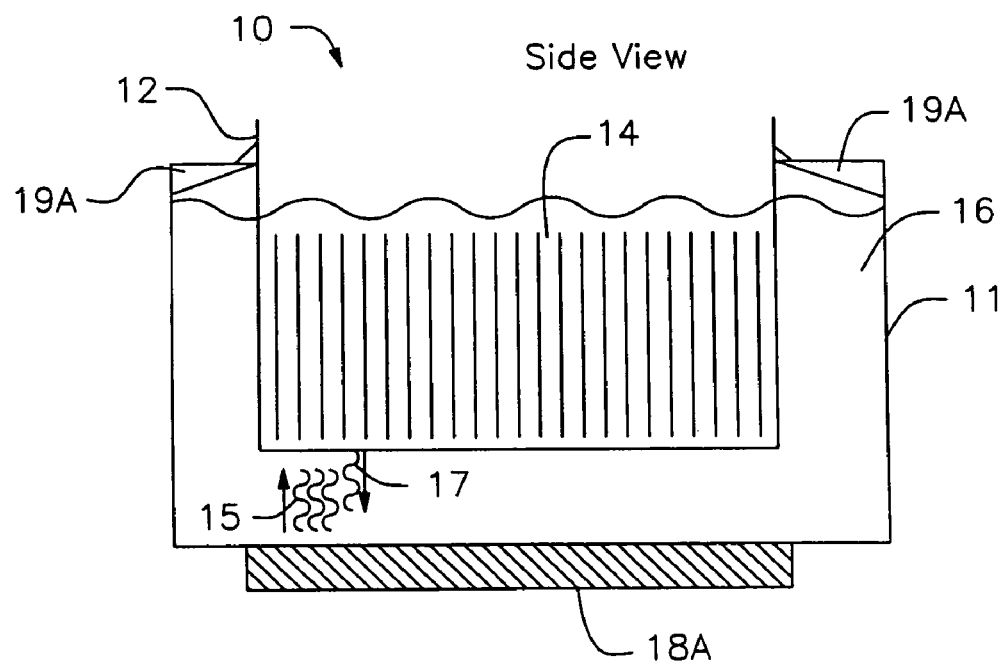
FIG. 1A is a diagram of a typical batch substrate cleaning system.
Figure 1C:
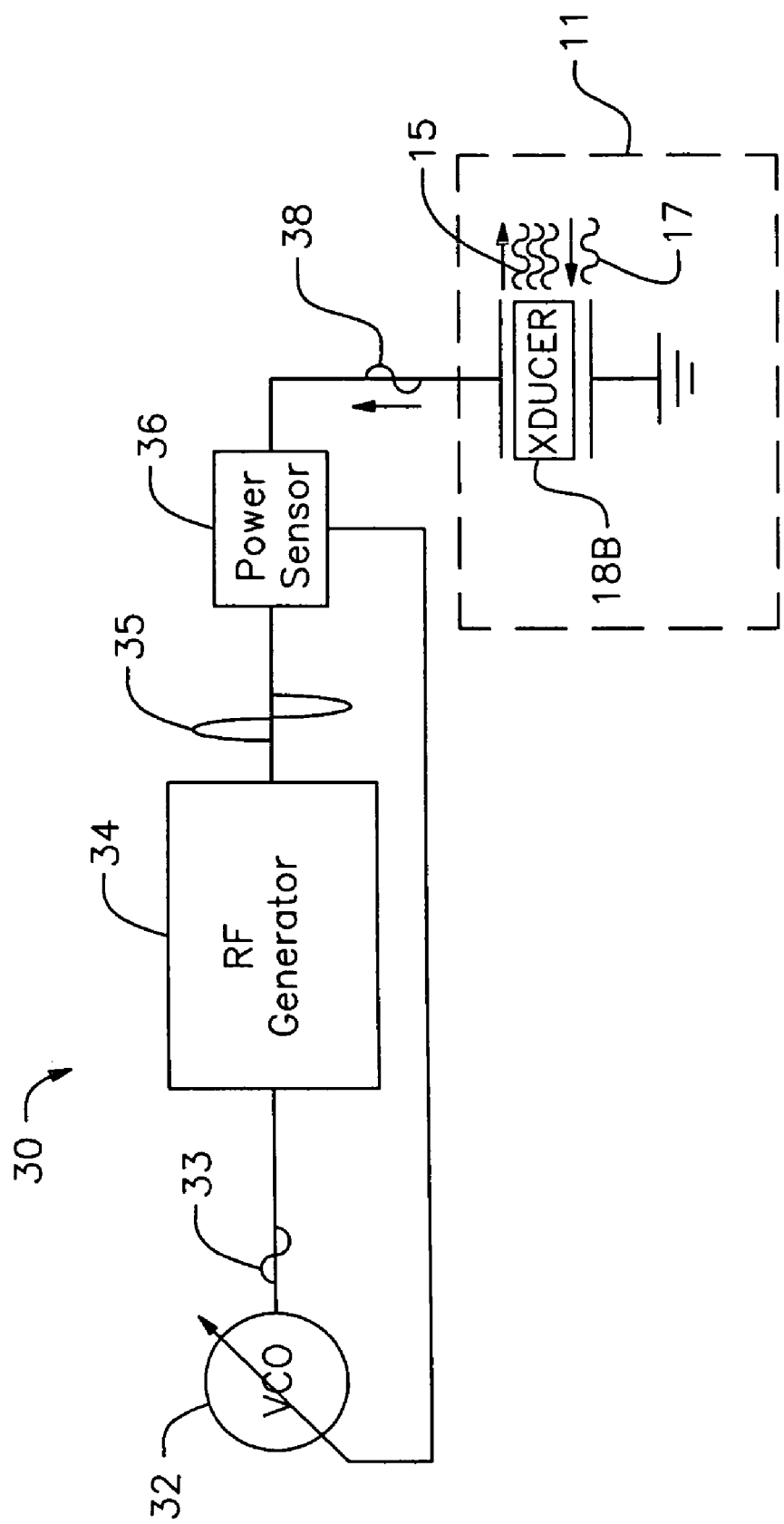
FIG. 1C is a prior art, schematic of an RF supply to supply one or more of the transducers.
Figure 1D:
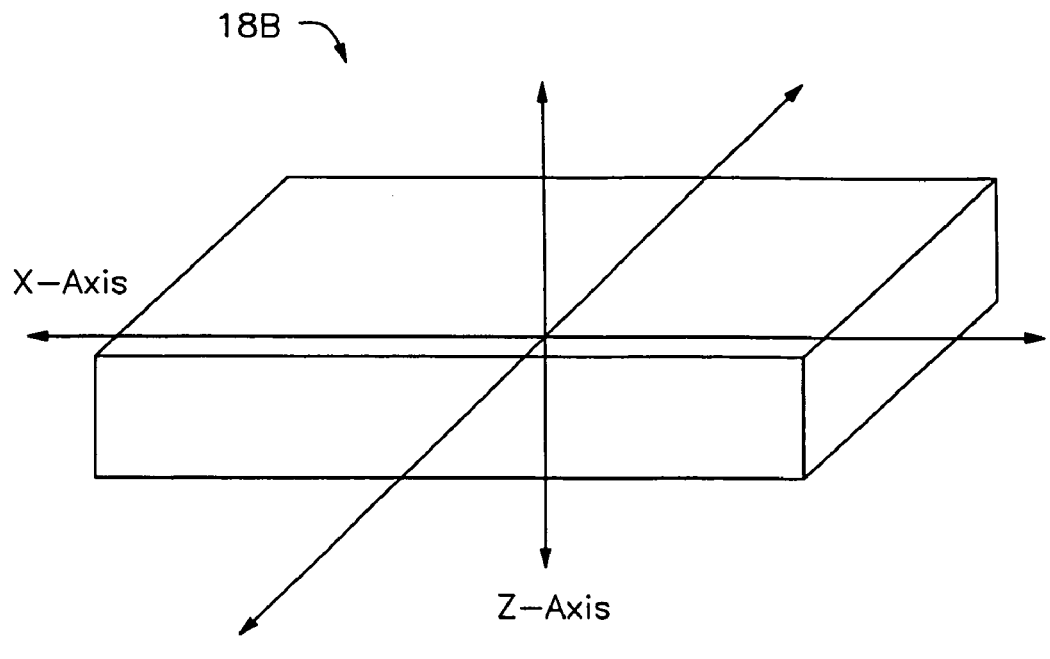
FIG. 1D is a typical transducer 18B.
Figure 1E:
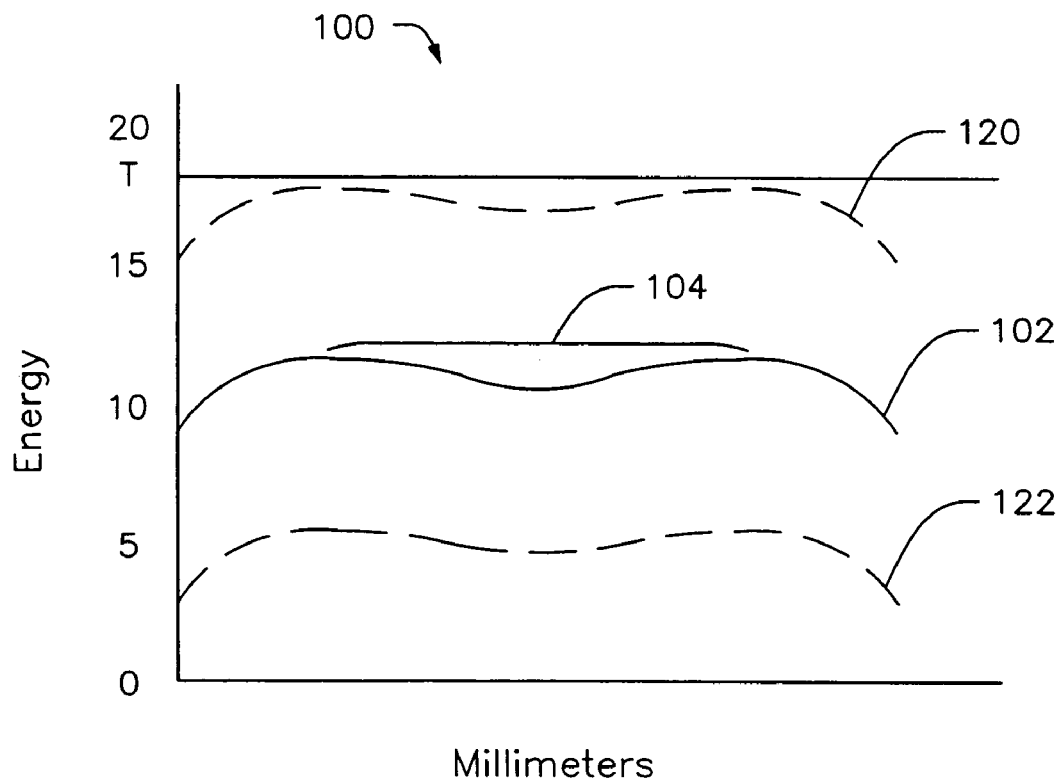
FIG. 1E is a graph of the energy distribution across the transducer.
Figure 2A:
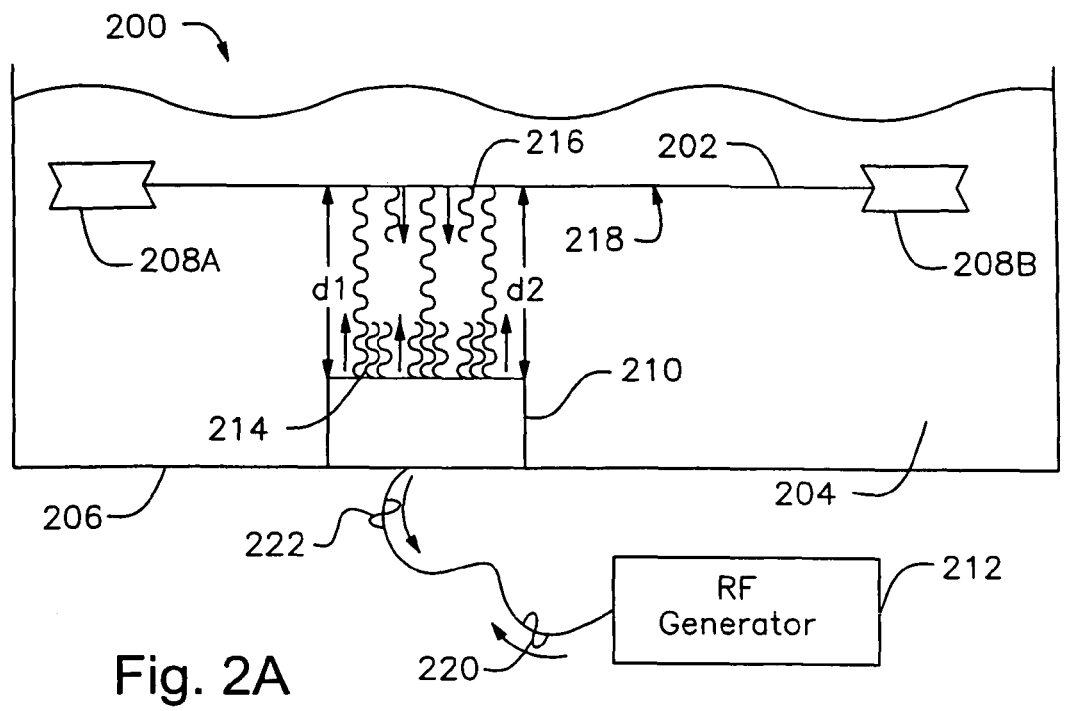
FIGS. 2A and 2B show a dynamic, single substrate cleaning system, in accordance with one embodiment of the present invention.
Figure 2B:
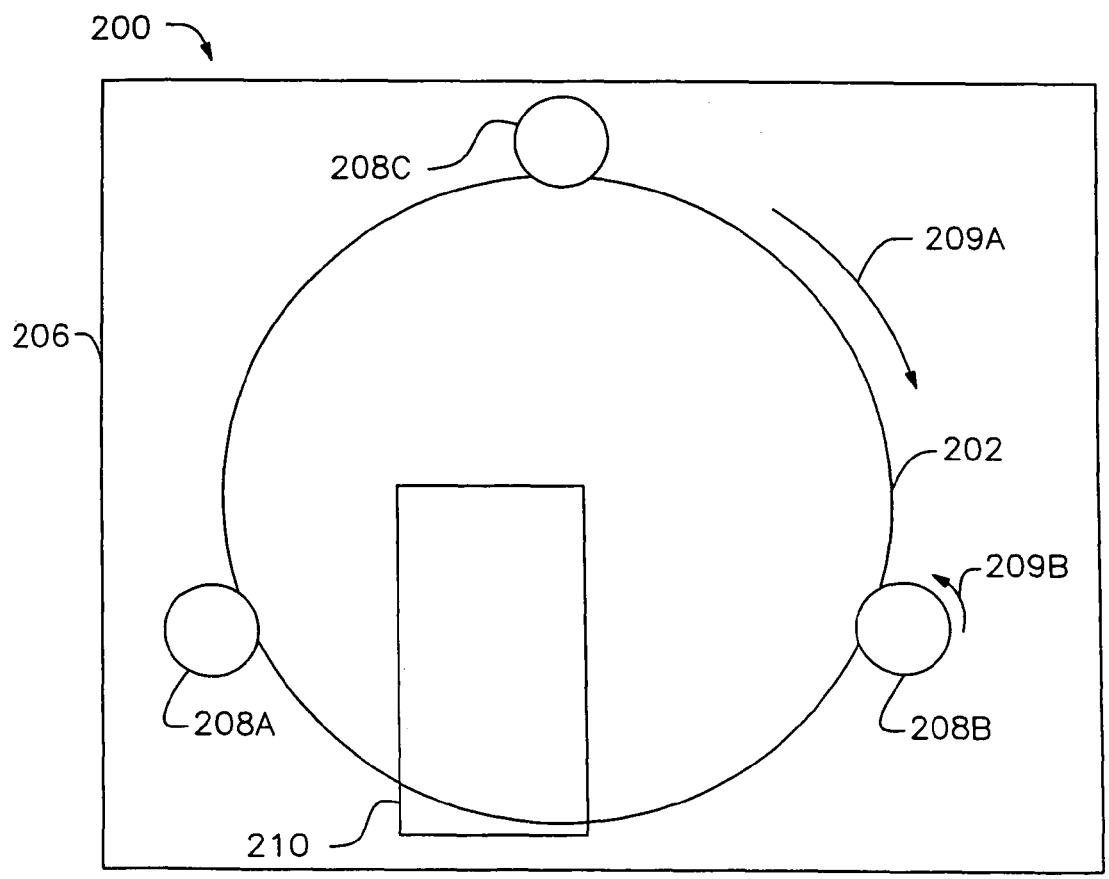

FIGS. 2A and 2B show a dynamic, single substrate cleaning system 200, in accordance with one embodiment of the present invention. FIG. 2A shows a side view of the dynamic, single substrate cleaning system 200. FIG. 2B shows a top view of the dynamic, single substrate cleaning system 200. The substrate 202 is immersed in cleaning solution 204 contained within a cleaning chamber 206. The cleaning solution 204 can be deionized water (DI water) or other cleaning chemistries that are well known in the art and combinations thereof.

The substrate 202 is substantially circular and is held by three or more edge rollers 208A, 208B, 208C (or similar edge holding devices) so that the substrate 202 can be rotated (e.g., in direction 209A) as the cleaning process is applied to the substrate 202. One or more of the three edge rollers 208A, 208B, and 208C can be driven (e.g. in direction 209B) so as to rotate the substrate 202 in direction 209A. The substrate 202 can be rotated at a rate of up to about 500 RPM.

A transducer 210 is also included as part of the cleaning chamber 206. The transducer 210 can be a piezoelectric device such as a crystal that can convert an RF signal 220 to acoustic energy 214 emitted into the cleaning solution 204. The transducer 210 can be composed of piezoelectric material such as piezoelectric ceramic, lead zirconium tintanate, piezoelectric quartz, gallium phosphate wherein the piezoelectric material is bonded to a resonator such as ceramic, silicon carbide, stainless steel or aluminum, or quartz.

As shown in FIG. 2B, the transducer 210 can be significantly smaller than the substrate 202. Smaller transducers can be manufactured more inexpensively and can also offer improved control over the smaller area of the substrate 202 that the emitted energy 214 emitted from the smaller transducer 210 impacts. The active surface 218 (i.e., the surface having the active devices thereon) of the substrate 202 is typically facing the transducer 210. However, in some embodiments the active surface 218 can be on the side of the substrate 202 opposite the transducer 210.

The three edge rollers 208A, 208B, 208C hold the substrate 202 approximately a fixed distance d1 from the transducer 210 as the substrate 202 rotates past the transducer 210. Distance d1 can be within a range of only a few millimeters to up to about 100 mm or more. The distance d1 is selected as a distance that matches the impedance of the transducer 210. In one embodiment the distance d1 is selected as a resonant distance for the frequency of the emitted energy 214. Alternatively, the frequency of the emitted energy 214 can be selected so that the distance d1 is a resonant distance. In either embodiment, at resonance, the minimum reflected energy 216 is reflected from the substrate 202 back toward the transducer 210. As described above, the reflected energy 216 can interfere with the emitted energy 214 which can decrease the power efficiency of the RF signal 220 and can cause decreased cleaning effectiveness (e.g., interference patterns) on the substrate 210.

However, the substrate 202 can "wobble" somewhat such that the distance between the substrate 202 and the transducer 210 can vary between the first distance d1 to a second distance d2 as the substrate 202 rotates past the transducer 210. The difference between the first distance d1 and the second distance d2 can be up to about 0.5 mm (0.020 inches) or even greater. While improved edge rollers 208A, 208B, 208C and other similar technologies may be able to hold the substrate 202 a more consistent distance d1 from the transducer 210, the improved edge rollers cannot guarantee an absolute constant distance d1 and therefore variations in the distance d1 can still occur. Further, the distance between the substrate 202 and the transducer 210 can vary for other reasons as well (e.g. placement of the substrate 202 within the edge rollers 208A, 208B, 208C, etc.). As will be described in more detail below, the variation in the distance between the substrate 202 and the transducer 210 can severely impact performance and efficiency of the cleaning system 200.

Figure 2C:
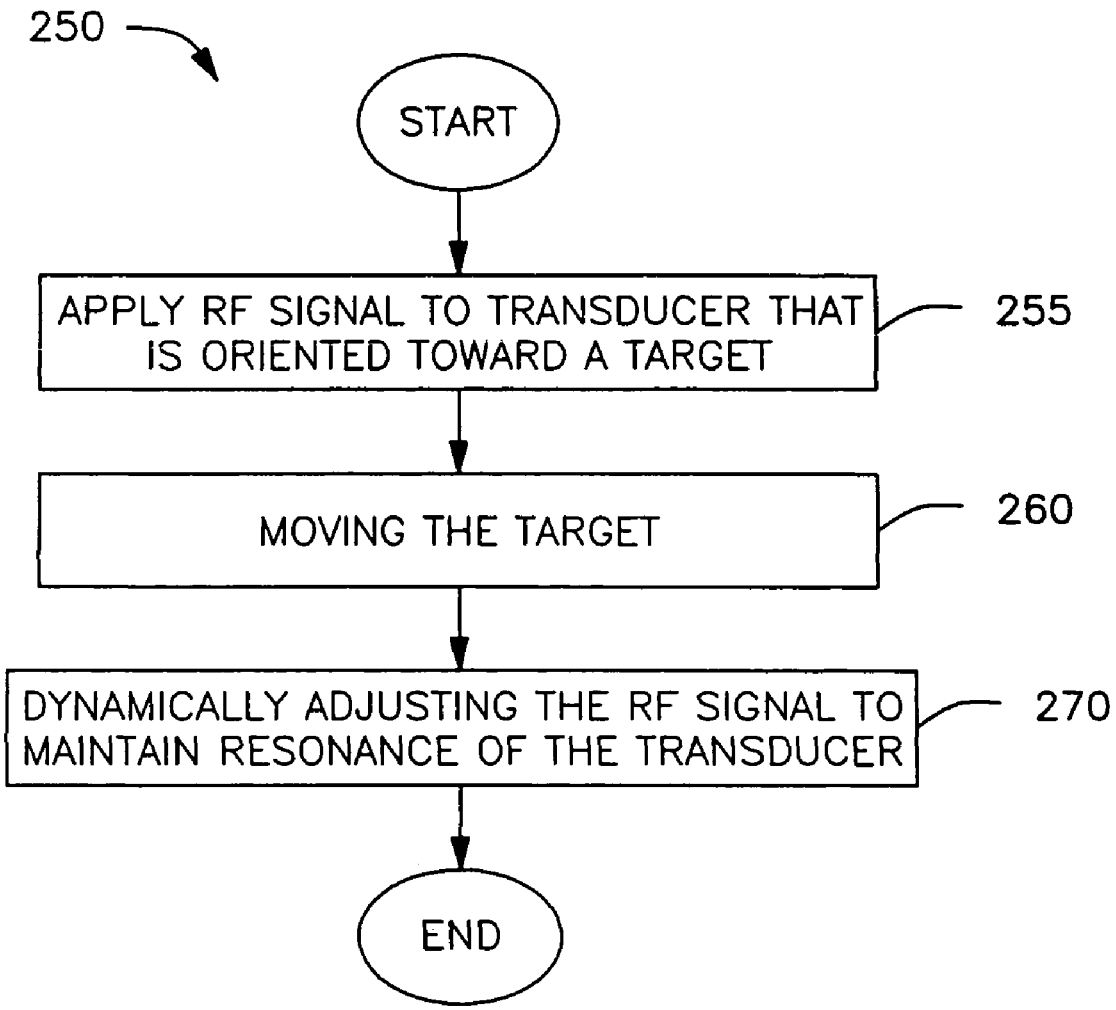
FIG. 2C is a flowchart of the method operations of an auto-tuning RF generator system used in a megasonic cleaning system, such as described in FIGS. 2A and 2B above, in accordance with one embodiment of the present invention.

The transducer 210 is coupled to an RF generator 212. FIG. 2C is a flowchart of the method operations 250 of an auto-tuning RF generator system used in a megasonic cleaning system 200, such as described in FIGS. 2A and 2B above, in accordance with one embodiment of the present invention. In operation 255, the RF generator provides the RF signal 220 to the transducer 210. The RF signal 220 can have a frequency of between about 400 kHz to about 2 MHz but is typically between about 700 kHz to about 1 MHz. The wavelength of the high frequency acoustic energy 214 emitted from the transducer 210 is about 1.5 mm (0.060 inches) in length, in the cleaning solution 204.

In operation 260, the distance to the target (e.g., substrate 202) varies as the target is moved, relative to the transducer 210. As the distance d1 varies the amount of reflected energy 216 also varies because the emitted energy 214 is not always in resonance when the distance d1 changes (i.e. the impedance of the transducer 210 is mismatched). In operation 270, the RF generator 212 is automatically and dynamically tuned so that the RF signal 220 is constantly tuned to correct for any impedance mismatches as the distance d1 changes.

Because a wavelength of the emitted energy 214 is about 1.5 mm (0.060 inches), a movement of only 0.50 mm (0.020 inches) can cause a significant impedance variation resulting in, for example, as much as a 50% variation in voltage and power varying between about 25% and 100%. Without an auto-tuning RF generator to compensate for the variations in d1, the peak energy level of the emitted energy 214 must be reduced to a low enough value that the energy absorbing ability of the substrate 202 (energy threshold) is not exceeded so as to prevent the peak emitted energy 214 from damaging the substrate 202.

The auto-tuning RF generator 212 can be automatically tuned to compensate for the variations in the distance d1 through varying approaches. In one embodiment, a peak voltage is detected so as to maintain the RF generator 212 at an impedance optimized frequency of the RF signal 220. In another embodiment, the phase of the voltage is maintained so as to produce an impedance optimized frequency of the RF signal 220. In yet another embodiment, the power supply can be adjusted to impedance optimize the RF signal 220. The various embodiments can also be used in combination within a single auto-tuning RF generator system.

Figure 3:
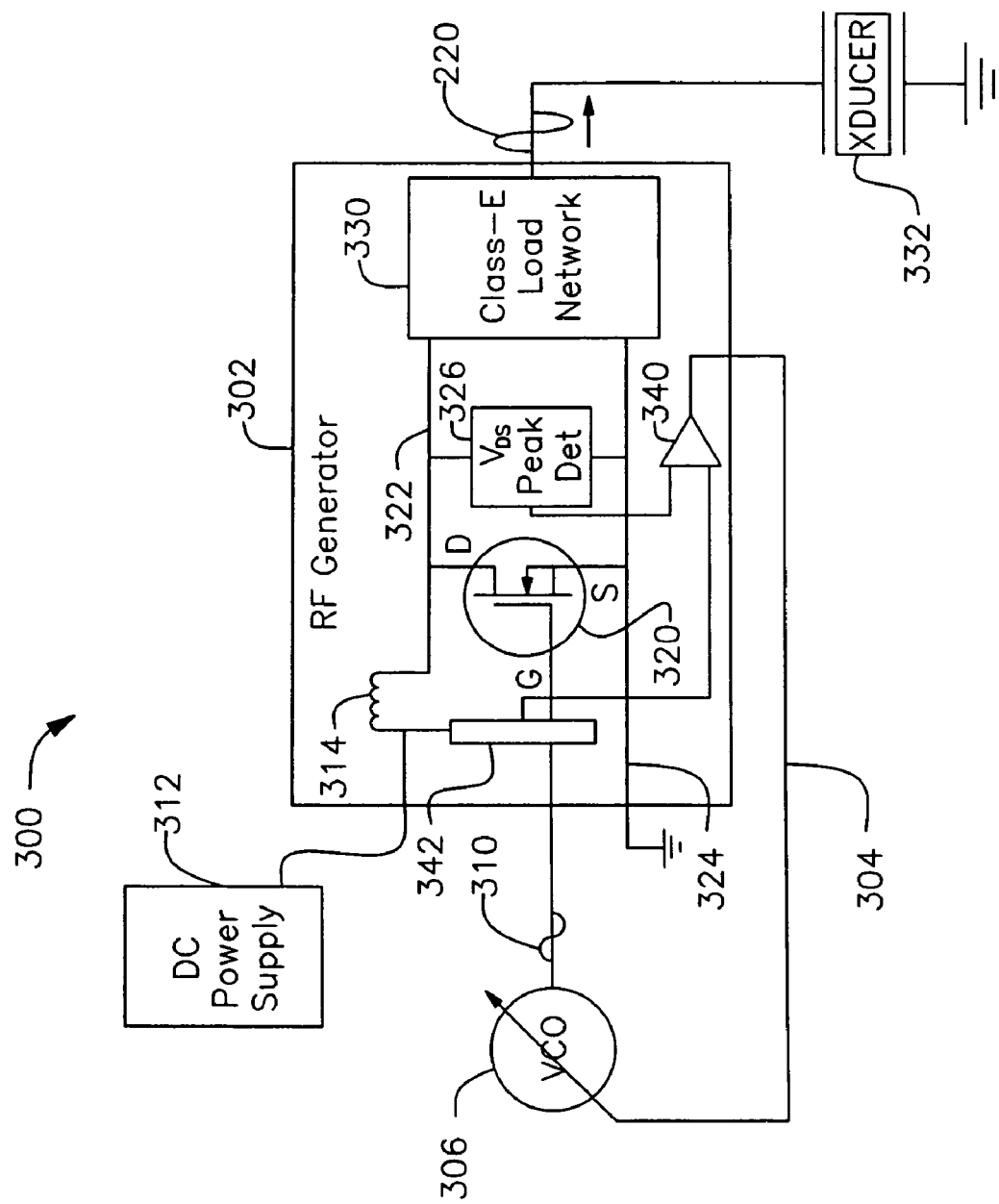
FIG. 3 is a block diagram of an auto-tuning RF generator system in accordance with one embodiment of the present invention.

FIG. 3 is a block diagram of an auto-tuning RF generator system 300 according to one embodiment of the present invention. The auto-tuning RF generator 302 provides a feedback control signal to the voltage controlled oscillator (VCO) 306 so as to adjust the frequency of a VCO RF signal 310 output from the VCO 306. The VCO 306 can also be included as part of the RF generator 302. A DC power supply 312 is included and provides DC power for the amplification of the VCO RF signal 310 in the RF generator 302. The auto-tuning RF generator 302 includes an inductor 314 in the input portion of the RF generator 302. One or more amplifiers 320 that amplify the VCO RF signal 310 are also included in the RF generator 302.

In one embodiment, the amplifier 320 is a CMOS and the VCO RF signal 310 is applied to a gate G. A drain D is coupled to DC bias rail 322 and a source S is coupled to a ground potential rail 324. A peak voltage drain to source (peak $V_{ds}$) detector 326 is coupled across the drain D and source S terminals of the amplifier 320 so as to capture the peak voltage drain to source of the amplifier 320.

The output of the amplifier 320 is coupled to an input of a class-E load network 330. The class-E load network 330 is a common device well known in the art for performing large-scale impedance matching functions between an RF source (i.e., RF generator 302) and an RF load (i.e. transducer 332). The class-E load network 330 typically includes a LC network. An output of the class-E load network 330 is coupled to an input to the transducer 332.

Figure 4:
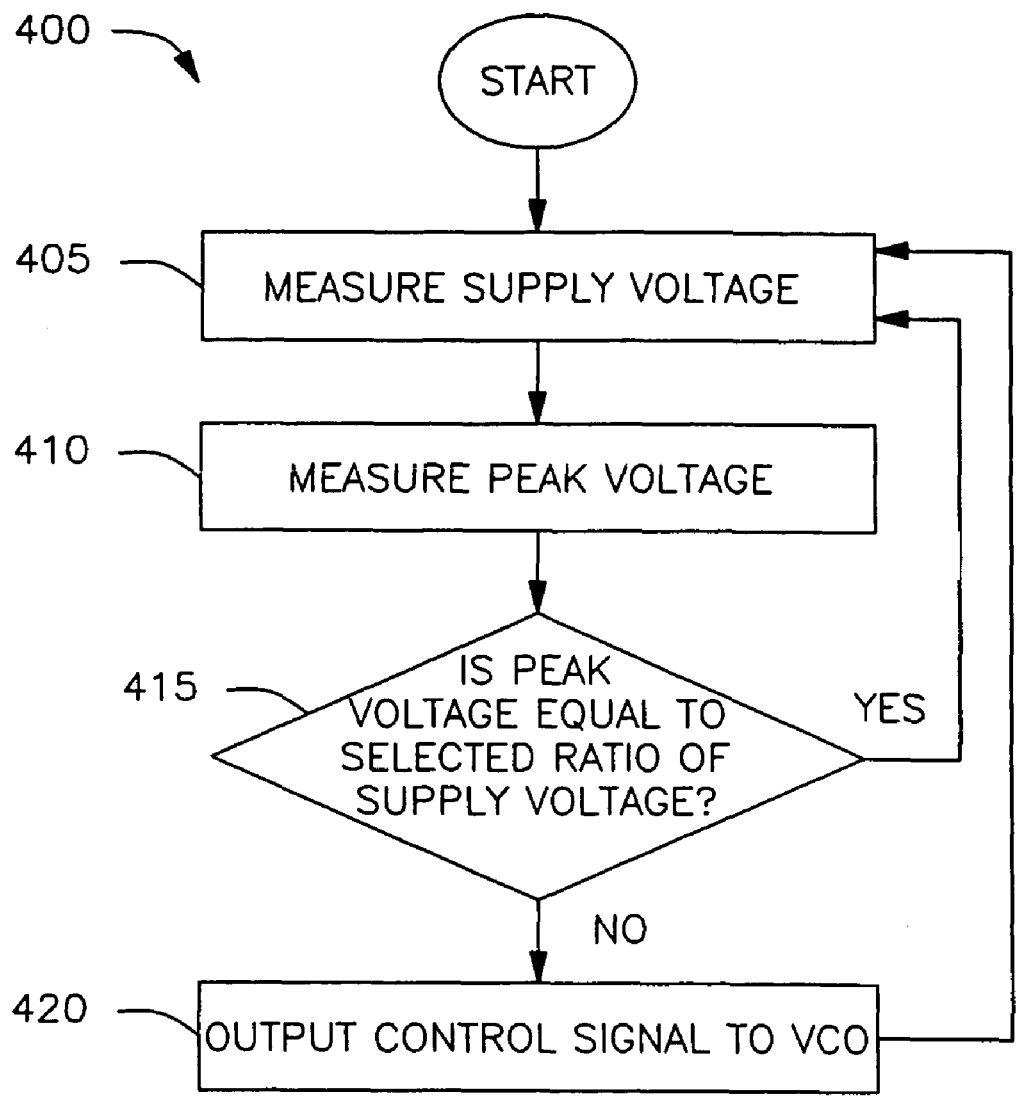
FIG. 4 is a flowchart of the method operations of the auto-tuning RF generator system while the RF generator is supplying an RF signal to the transducer, in accordance with one embodiment of the present invention.

FIG. 4 is a flowchart of the method operations 400 of the auto-tuning RF generator system 300 while the RF generator 302 is supplying an RF signal 220 to the transducer 332, in accordance with one embodiment of the present invention. In operation 405, the DC supply voltage is measured or detected by a comparator device 340. A voltage divider network 342 can also be included to scale or reduce the amplitude of the respective voltage coupled to the comparator device 340 from the DC power supply 312 to a level useable by the comparator device 340. Proportional, differential and integral controls can also be included in the comparator device 340 so that the rate and amount of change in the control signal can be selected.

In operation 410, the peak $V_{ds}$ is detected by the peak $V_{ds}$ detector 326 and applied to a second input of the comparator device 340. The peak $V_{ds}$ detector 326 can also include circuitry to scale or reduce the amplitude of the voltage coupled to the comparator device 340 from the peak $V_{ds}$ detector 326 to a level useable by the comparator device 340.

By way of example, the DC power supply 312 may output 200 VDC and the comparator device 340 is capable of comparing a 5 VDC signal, therefore the voltage divider network 342 can scale DC power supply voltage from 200 VDC to a voltage of 5 VDC that represents 200 VDC in the comparator device 340. Similarly, the peak $V_{ds}$ detector 326 can also include scaling devices such as a voltage divider network so that the actual peak $V_{ds}$ voltage applied to the comparator device 340 is about 5 VDC.

In operation 415, the comparator device 340 compares the peak $V_{ds}$ and the DC supply voltage from the DC power supply 312. If the DC supply voltage is a desired ratio of the peak $V_{ds}$, then no correction signal is output from the comparator device and the method operations continue in operation 405 above.

Alternatively, if the DC supply voltage is not a desired ratio of the peak $V_{ds}$, then the method operations continue in operation 420. In operation 420, a corresponding correction signal is output from the comparator device 340 to the VCO 306 to adjust the frequency of the VCO output signal 310 and the method operations continue in operation 405 above. The correction signal can adjust the frequency of the VCO RF signal 310 to a higher or lower frequency as required.

The desired ratio of the DC supply voltage to the peak $V_{ds}$, is dependant upon the particular values of the various components in the RF generator 302 and the transducer 332 and the system that may include the RF generator 302 and the transducer 332, such as the substrate cleaning system 200 of FIG. 2 above. In one embodiment, the desired ratio is within a range of about 3:1 to about 6:1, where the peak $V_{ds}$ is a larger voltage than the DC supply voltage. In one embodiment the desired ratio is about 4:1 and more specifically about 3.6:1 where the peak $V_{ds}$ is about equal to about a 3.6 multiple of the DC supply voltage.

Figure 5A:
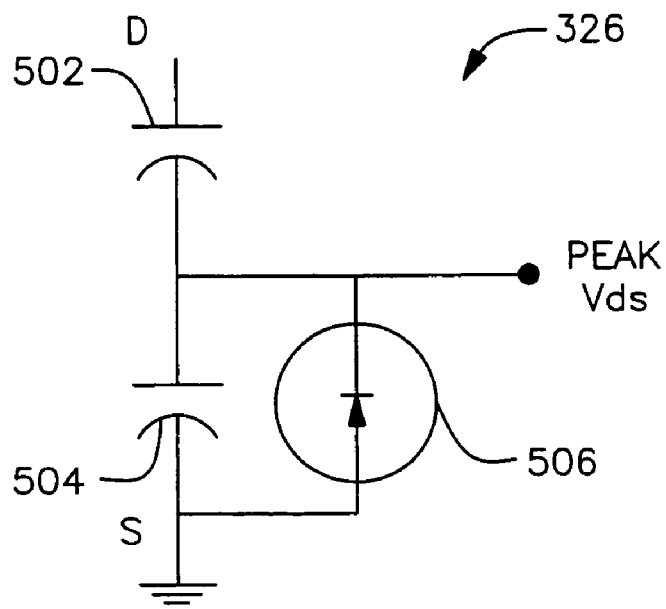
FIG. 5A is a schematic diagram of the peak $V_{ds}$ detector in accordance with one embodiment of the present invention.

FIG. 5A is a schematic diagram of the peak $V_{ds}$ detector 326 in accordance with one embodiment of the present invention. Serially connected capacitors 502, 504 are coupled across the drain D and source S of the amplifier 320. A diode 506 is coupled in parallel with capacitor 504. In operation, capacitor 502 couples the peak $V_{ds}$ of each cycle of the amplified RF signal to capacitor 504. Capacitor 504 stores the peak $V_{ds}$ for each cycle of the amplified RF signal that is output from the amplifier 320. Diode 506 captures the peak $V_{ds}$ and couples the peak $V_{ds}$ to the comparator device 340 via the peak $V_{ds}$ terminal.

Figure 5B:
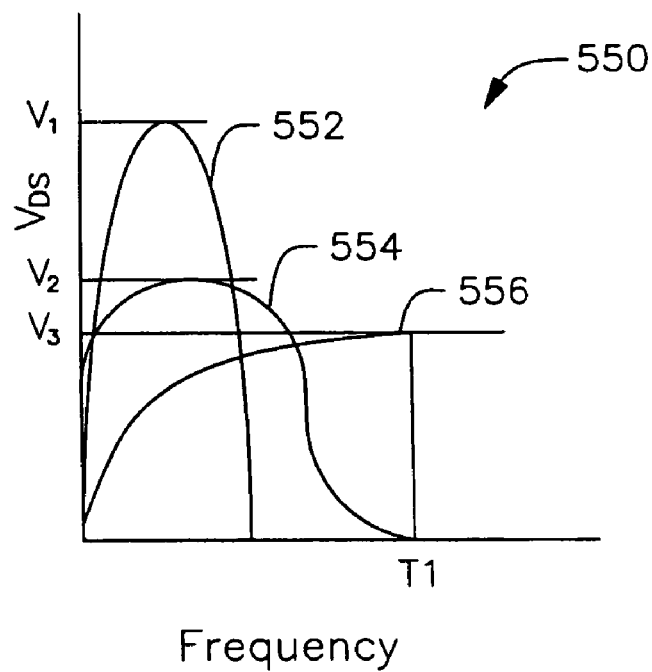
FIG. 5B is a graph of waveforms of the peak voltage ($V_{ds}$) detected by the peak voltage detector, in accordance with one embodiment of the present invention.

FIG. 5B is a graph 550 of waveforms of the peak voltage ($V_{ds}$) detected by the peak voltage detector 326, in accordance with one embodiment of the present invention. When the amplifier device 320 is conducting, the peak voltage detector 326 does not detect much voltage because there is little voltage drop across the amplifier 320. When the amplifier stops conducting, then the current stored in the inductors and capacitors of the RF generator 302 and load network 330 is discharged, resulting in a voltage waveform 552, 554, 556 as detected by the peak voltage detector 326. The amplifier 320 is designed such that as the voltage across the amplifier 320 ($V_{ds}$) drops to zero, the amplifier 320 begins to conduct thus creating a tuned amplification circuit. The tuned amplification circuit is affected by any changes in resonance of the transducer 332 (e.g., any movement of the substrate 202 relative to the transducer 332), which are reflected through the load network 330 to change the detected waveform 552, 554, 556. When in resonance, the amplifier 320 acts as a well tuned class-E amplifier and the waveform 554 occurs. When off resonance, the transducer 332 can have either capacitive or inductive reactance resulting in added capacitive or inductive reactance, which detunes the class-E load network 330. The detuned class-E load network 330 results in either waveform 552 or 556, having either a too high peak voltage V1 or too low peak voltage V3.

Through experimentation and calculation, it has been found that the peak voltage ($V_{ds}$) is a function of the resonance of the transducer 332 and the peak $V_{ds}$ compared to the applied DC bias voltage has a resonant ratio that is a function of the components of the RF generator circuit 302. For example, in a typical RF generator, the ratio is about 4:1 peak voltage as compared to the DC bias voltage from the DC power supply, or restated, a peak $V_{ds}$ of about 4 multiples of the bias voltage from the DC power supply 312 indicates that the transducer 332 is in resonance.

Figure 6:
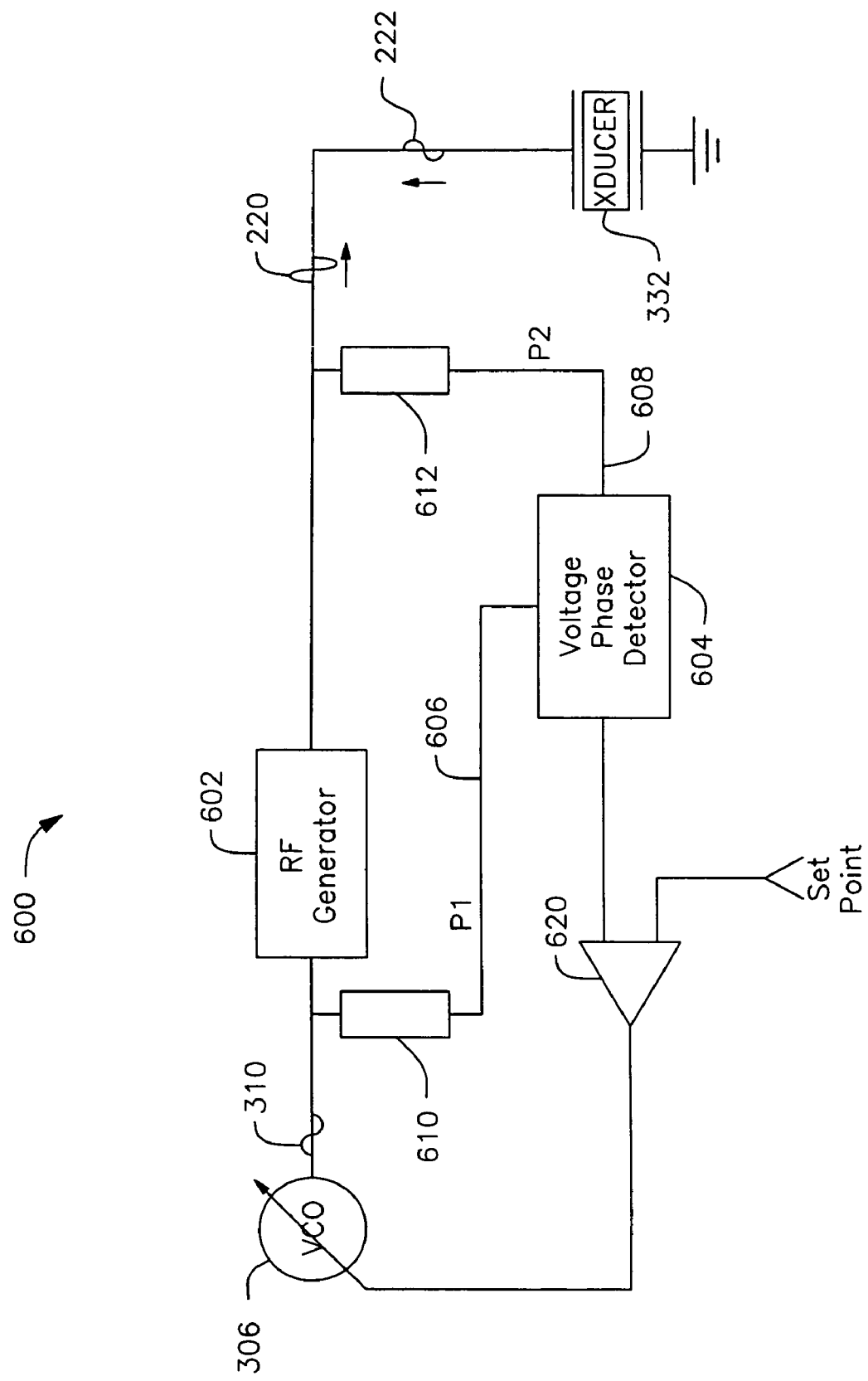
FIG. 6 is a block diagram of an auto-tuning RF generator system according to one embodiment of the present invention.

FIG. 6 is a block diagram of an auto-tuning RF generator system 600 according to one embodiment of the present invention. A phase P1 of the voltage of the RF signal 310 output from the VCO 306 is compared to a phase P2 of the voltage of the input to the transducer 332. If the voltage phases P1 and P2 do not match, a correction signal is applied to the frequency control input of the VCO 306. The RF generator system 600 includes an RF generator 602. The RF generator 602 can be any type of RF generator known in the art. A phase detector 604 includes two inputs 606, 608. The first and second inputs 606, 608 can also include respective scaling circuits 610, 612 (e.g., voltage divider networks) that can scale the detected signals (e.g. phase P1 and phase P2) to a level useable by the phase detector 604. The phase detector 604 can be any type of phase detector known in the art that can detect and compare the phases of the respective input voltage signals. Prior art phase detectors compared the phases of the voltage and current of the output RF signal 220. Testing has shown that comparing the voltage phases P1 and P2 can be accomplished more simply and easily and provide the needed signal for adjusting the VCO 306 accordingly.

Figure 7:
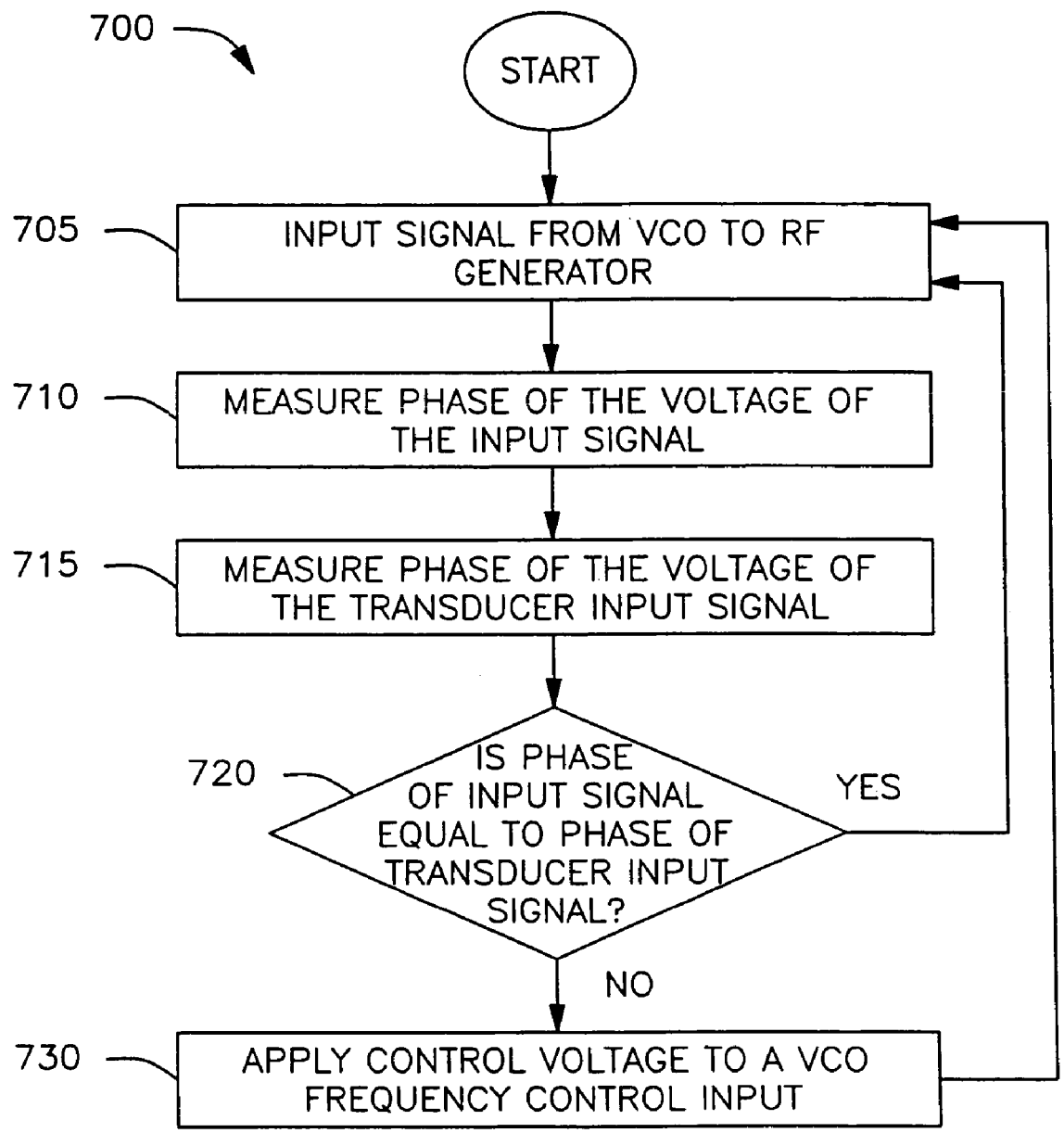
FIG. 7 is a flowchart of the method operations of the auto-tuning RF generator system according to one embodiment of the present invention.

FIG. 7 is a flowchart of the method operations of the auto-tuning RF generator system 600 according to one embodiment of the present invention. In operation 705, an input RF signal 310 from the VCO 306 is applied to the RF generator 602 and the RF generator 602 amplifies the input RF signal 310 and couples the amplified RF signal 220 to the transducer 332.

In operation 710, the first input 606 couples a first phase (P1) of the voltage of the RF signal 310 output from the VCO 306 to the phase detector 604. In operation 715 the second input 608 couples a second phase (P2) of the voltage of the signal input to the transducer 332 to the phase detector 604.

Figure 8:
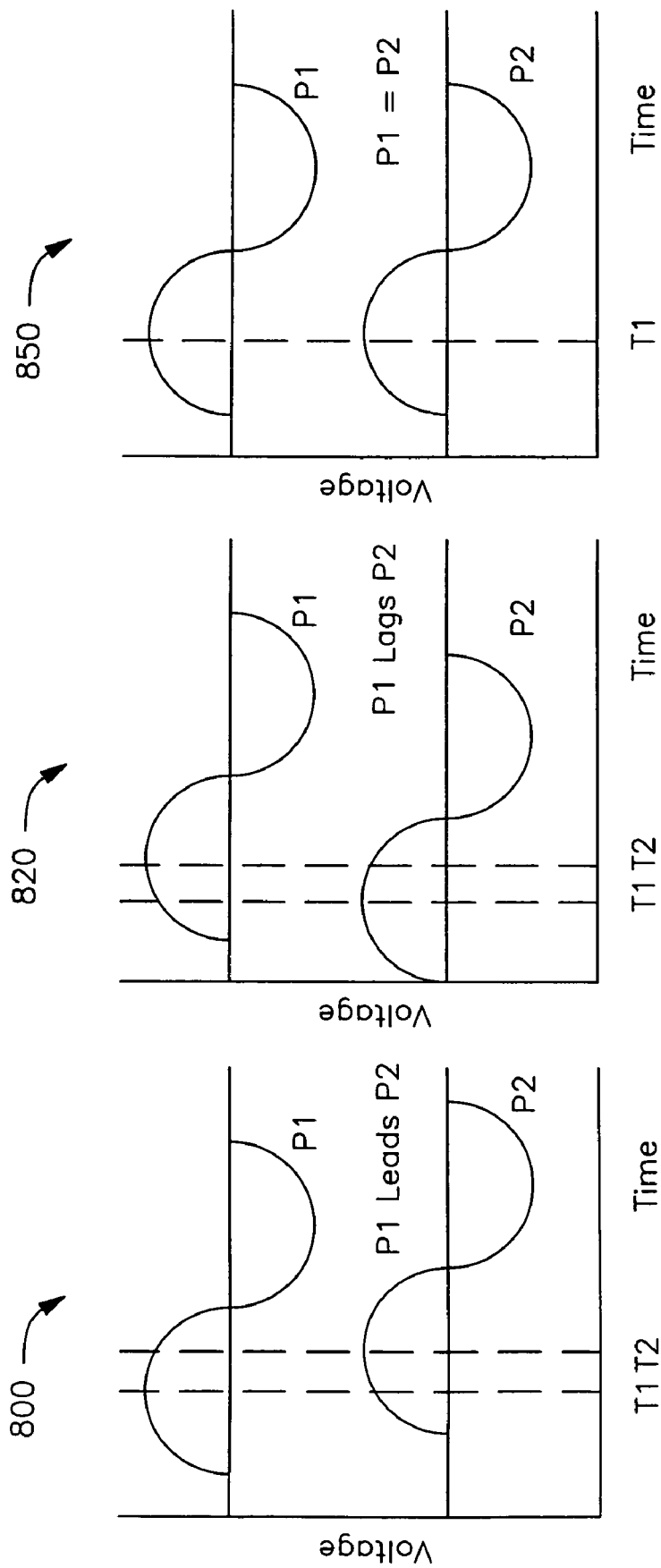
FIGS. 8A-8C show graphs of three examples of the relationships between phase P1 and phase P2 in accordance with one embodiment of the present invention.

In operation 720, the phase detector compares phase P1 and phase P2 to determine if the phase P1 matches phase P2. FIGS. 8A-8C show graphs of three examples of the relationships between phases P1 and P2, in accordance with one embodiment of the present invention. In FIG. 8A, graph 800 shows phase P1 leads phase P2 (e.g., phase P1 peaks at time T1 and phase P2 peaks at a subsequent time T2). This indicates that the impedance of the transducer 332 is not matched and that the transducer 332 is applying a reflected signal 222 into the RF generator 602.

In FIG. 8B, graph 820 shows phase P1 lags phase P2 (e.g., phase P2 peaks at time T1 and phase P1 peaks at a subsequent time T2). This indicates that the impedance of the transducer 332 is not matched and that the transducer 332 is again applying a reflected signal 222 into the RF generator 602. The reflected signal 222 output by the transducer 332 can be constructively or destructively interfering with the signal 220 output from the RF generator 602.

In FIG. 8C, graph 850 shows phase P1 is equal to phase P2 (e.g., both phase P1 and phase P2 peak at time T1). This indicates that the impedance of the transducer 332 is matched and that the transducer 332 is not applying any reflected signal into the RF generator 602.

If, in operation 720, phase P1 and phase P2 are equal, then the method operations continue (repeat) at operation 705. If, however, in operation 720 phase P1 and phase P2 are not equal, then the method operations continue in operation 730. In operation 730, an appropriate control signal is applied to the frequency control input of the VCO 306 to adjust the frequency of the RF signal 310 accordingly, and the method operations continue (repeat) at operation 705. The control signal applied to the frequency control input of the VCO 306 can adjust the frequency to a higher frequency in response to a condition where phase P1 leads phase P2. Alternatively, the control signal applied to the frequency control input of the VCO 306 can adjust the frequency to a lower frequency in response to a condition where phase P1 lags phase P2.

The auto-tuning RF generator system 600 can also include a control amplifier 620 that can scale the control signal output by the phase detector 604 to the correct signal level to control the VCO 306. The control amplifier 620 can also include a set point input so the control amplifier 620 can combine the set point input and the control signal input from the phase detector. In this manner a VCO RF signal 310 can be selected by the set point and then the control signal output by the phase detector 604 can automatically adjust the selected set point.

The systems and methods described in FIGS. 3 through 8C above can automatically tune the RF generators 302, 602 at a very high correction rate (e.g., at each cycle of the input RF signal 310 can cause a subsequent correction in the frequency of the RF signal 310 and the output RF signal 220). As a result, the frequency of the input RF signal 310 can be corrected, for example, multiple times during each revolution of the substrate 202 and thereby providing much more precise control of the acoustic energy 214 applied to the substrate 202.

By way of example, if the substrate 202 is being rotated 60 RPM (i.e. 1 revolution per second) and the RF signal 310 is about 1 MHz, then the frequency of the RF signal 310 can be adjusted about one million times per second (i.e., once per microsecond) during each rotation of the substrate 202. This increased control of the acoustic energy 214 applied to the substrate 202 means that the average energy can be very close to the minimum energy valley and the maximum energy peak of the emitted energy 214. Therefore a higher average energy can be applied to the substrate 202, which thereby allows a significantly reduced cleaning process time and improved cleaning effectiveness.

Figure 9:
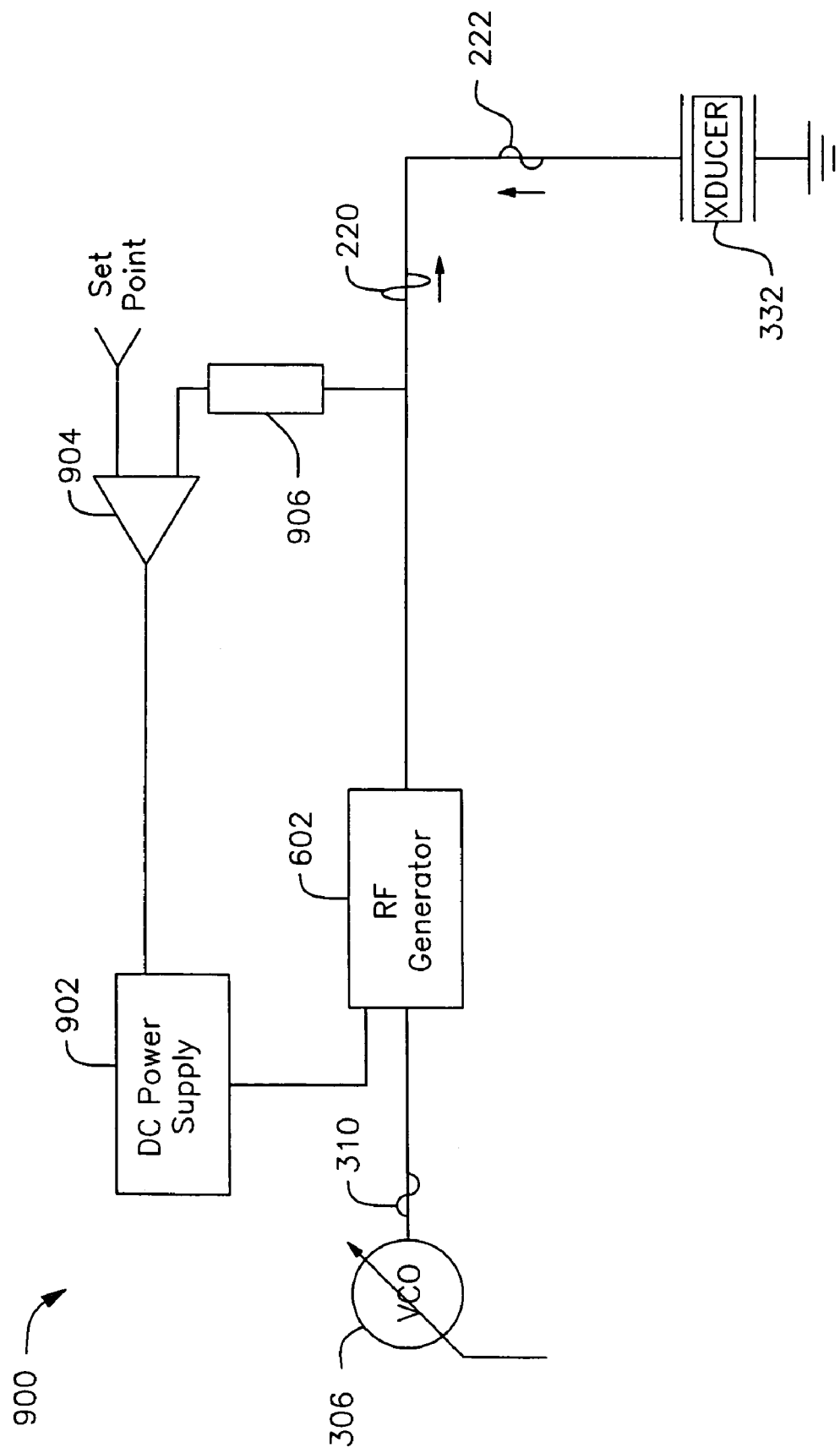
FIG. 9 is a block diagram of an auto-tuning RF generator system according to one embodiment of the present invention.

FIG. 9 is a block diagram of an auto-tuning RF generator system 900 according to one embodiment of the present invention. The system includes a VCO 306 that is coupled to an input of an RF generator 602. A variable DC power supply 902 is coupled to the RF generator 602 and provides DC power for the RF generator to amplify the RF signal 310 from the VCO 306. The output of the RF generator 602 is coupled to the transducer 332.

Typical prior art acoustic energy cleaning systems focus on maintaining a constant net power input to the transducer 332 (i.e., forward power of RF signal 220 less reflected power of reflected signal 222). Through experimentation, it has been found that if the voltage of the RF signal 220 is maintained as a constant voltage, then the amplitude of the emitter energy 214 output from the transducer 332 is substantially constant. Further, maintaining the voltage of the RF signal 220 at a constant level, below the energy threshold limit of the substrate 202 protects the substrate from damage while also allowing a maximum acoustic energy 214 to be applied to the substrate 202.

Figure 10:
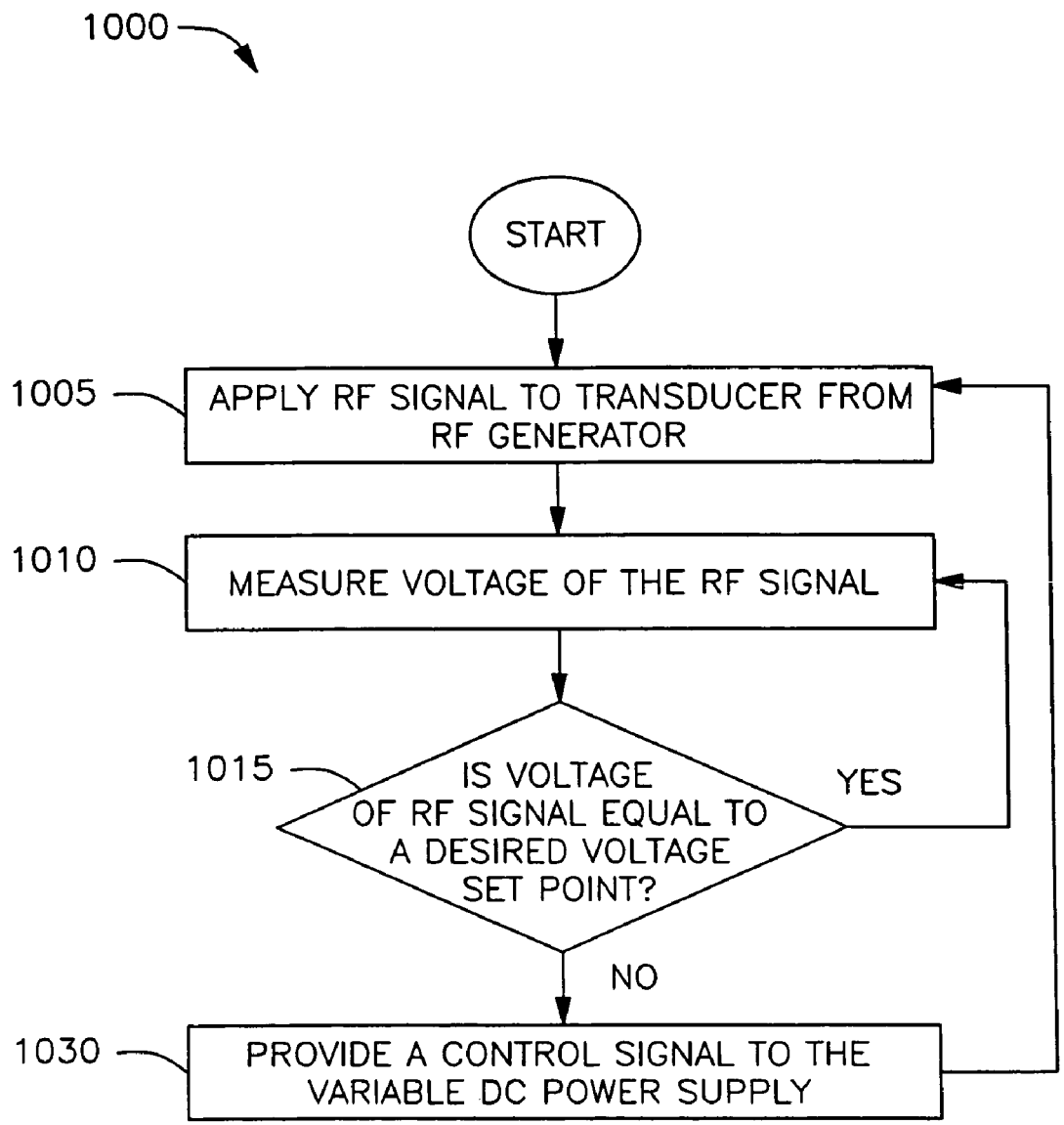
FIG. 10 is a flowchart of the method operations of the auto-tuning RF generator system, in accordance with one embodiment of the present invention.

FIG. 10 is a flowchart of the method operations of the auto-tuning RF generator system 900, in accordance with one embodiment of the present invention. In operation 1005, the RF generator 602 outputs an RF signal to the transducer 332. In operation 1010, a voltage of the RF signal output to the transducer 332 is measured and coupled to a comparator 904.

In operation 1015, the comparator 904 compares the voltage of the RF signal output from the RF generator 602 to a desired set point voltage. If the output voltage is equal to the desired set point voltage, the method operations continue at operation 1010. Alternatively, if the output voltage is not equal to the set point voltage, the method operations continue in operation 1030.

In operation 1030, the comparator 904 outputs a control signal to a control input on the variable DC power supply 902. By way of example, if the output voltage is too high (i.e., greater than the desired set point voltage), then the control signal will reduce the DC voltage output from the variable DC power supply 902 thereby reducing the gain of the amplification that occurs within the RF generator 602, thereby reducing the amplitude of the RF signal output by the RF generator 602. Proportional, differential and integral controls can also be included in the comparator 904 so that the rate and amount of change in the control signal can be selected.

A scaling circuit 906 can also be included to scale the voltage output from the RF generator 602 to a level more easily compared to the set point signal. By way of example, the scaling circuit 906 can scale a 200 V RF signal to 5 V for comparison to a 5 V set point signal. The scaling circuit 906 can include a voltage divider. The scaling circuit 906 can also include a rectifier to rectify the voltage of RF signal 220 output from the RF generator 602 to a DC voltage for comparison to a DC set point signal.

As described above the methods described in FIGS. 3 through 8C above can automatically tune the RF generators 302, 602 at a very high correction rate (e.g., once per a few cycles of the RF signal 310). Conversely, the system and method described in FIGS. 9 and 10 can also automatically tune the RF generator 602 but at a slightly slower rate than as described in FIGS. 3 through 8C but yet still faster than the likely changes in impedance of the transducer 332 due to the motion of the substrate 202. The system and method described in FIGS. 9 and 10 is somewhat slower due in part to the hysteresis included in the variable DC power supply 902.

The system and method described in FIGS. 9 and 10 can be used in combination with one or more of the systems and methods described in FIGS. 3 through 8C above. As such, the system and method described in FIGS. 9 and 10 can used to provide a very broad range of tuning the RF generator to the dynamic resonance of the transducer 332, while the systems and methods described in FIGS. 3 through 8C above can be used to provide very fine control and adjustment of the tuning the RF generator.

Figure 11:
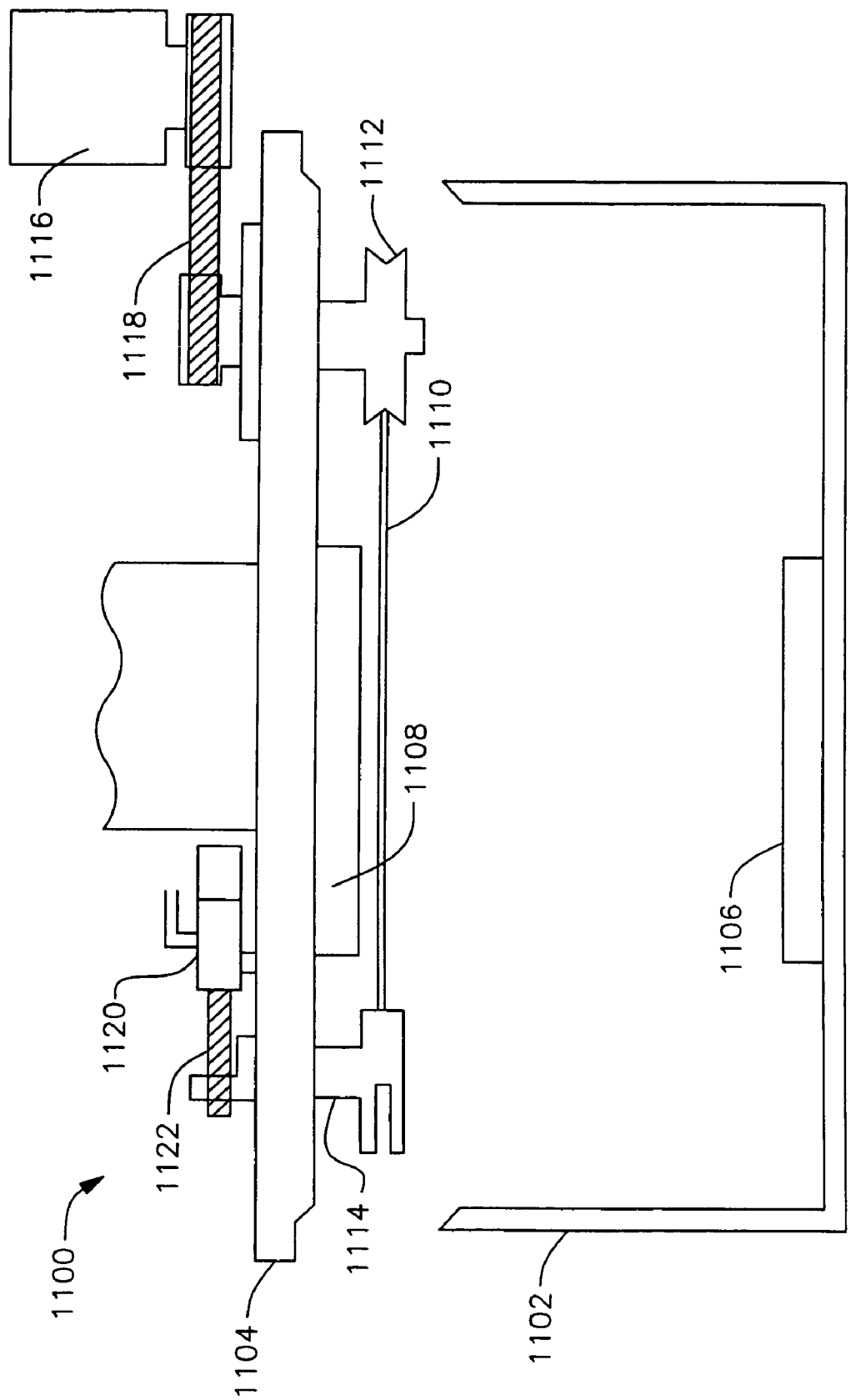
FIG. 11 is a diagram of a megasonic module in accordance with one embodiment of the present invention.

FIG. 11 is a diagram of a megasonic module 1100 in accordance with one embodiment of the present invention. The megasonic module 1100 can be a megasonic module, such as a the material described in commonly owned U.S. patent application Ser. No. 10/259,023, entitled "Megasonic Substrate Processing Module" which was filed on Sep. 26, 2002, which is incorporated by reference herein, in its entirety, for all purposes.

The megasonic module 1100 includes a substrate processing tank 1102 (hereinafter referred to as tank 1102), and a tank lid 1104 (hereinafter referred to as lid 1104). A lid megasonic transducer 1108 and a tank megasonic transducer 1106 are positioned on lid 1104 and in tank 1102, respectively, and provide megasonic energy for simultaneously processing an active and a backside surface of a substrate 1110. A substrate 1110 is positioned in drive wheels 1112, and secured in position with substrate stabilizing arm/wheel 1114. In one embodiment, the substrate stabilizing arm/wheel 1114 is positioned with an actuator 1120 and a positioning rod 1122 to open and close the stabilizing arm/wheel 1114 to receive, secure, and release a substrate 1110 to be processed in the megasonic module 1100. The lid 1104 can be positioned in an open or a closed position with a actuator system (not shown) that raises and lowers lid 1104 while the tank 1102 remains stationary. Alternatively the tank 1102 can be moved to mate with the lid 1104.

In one embodiment, substrate stabilizing arm/wheel 1114 is configured to secure and support substrate 1110 in a horizontal orientation for processing, and to allow rotation of substrate 1110. In other embodiments, substrate processing is performed with substrate 1110 in a vertical orientation. Drive wheels 1112 contact a peripheral edge of substrate 1110 and rotate substrate 1110 during processing. Substrate stabilizing arm/wheel 1114 can include a freely spinning wheel to allow for substrate 1110 rotation while supporting substrate 1110 in a horizontal orientation.

Once the substrate 1110 is placed in the tank 1102, the tank 1102 is then filled with processing fluid including deionized (DI) water, or processing chemicals as desired. Once the closed megasonic module 1100 is filled with desired processing fluid, and substrate 1110 is immersed therein, megasonic processing of substrate 1110 is accomplished by tank megasonic transducer 1106 directing megasonic energy against the surface of substrate 1110 facing the tank megasonic transducer 1106, and by lid megasonic transducer 1108 directing megasonic energy against the surface of substrate 1110 facing the lid megasonic transducer 1108. With substrate 1110 submerged in processing chemicals, drive wheels 1112 rotate substrate 1110 to ensure complete and uniform processing across the entire surface of both the active and backside surfaces of substrate 1110. In one embodiment, drive motor 1116 is provided to drive the drive wheels 1112 via a mechanical coupling 1118 (e.g., drive belt, gears, sprocket and chain, etc.).

An auto-tuning RF generator system as described in FIGS. 3-10 above can be coupled to one or both of the lid transducer 1108 and tank transducer 1106 so that the respective transducers 1108, 1106 are constantly and automatically tuned for the dynamic impedance of the respective transducers 1108, 1106 as the substrate 1110 is rotated.

Figure 12:
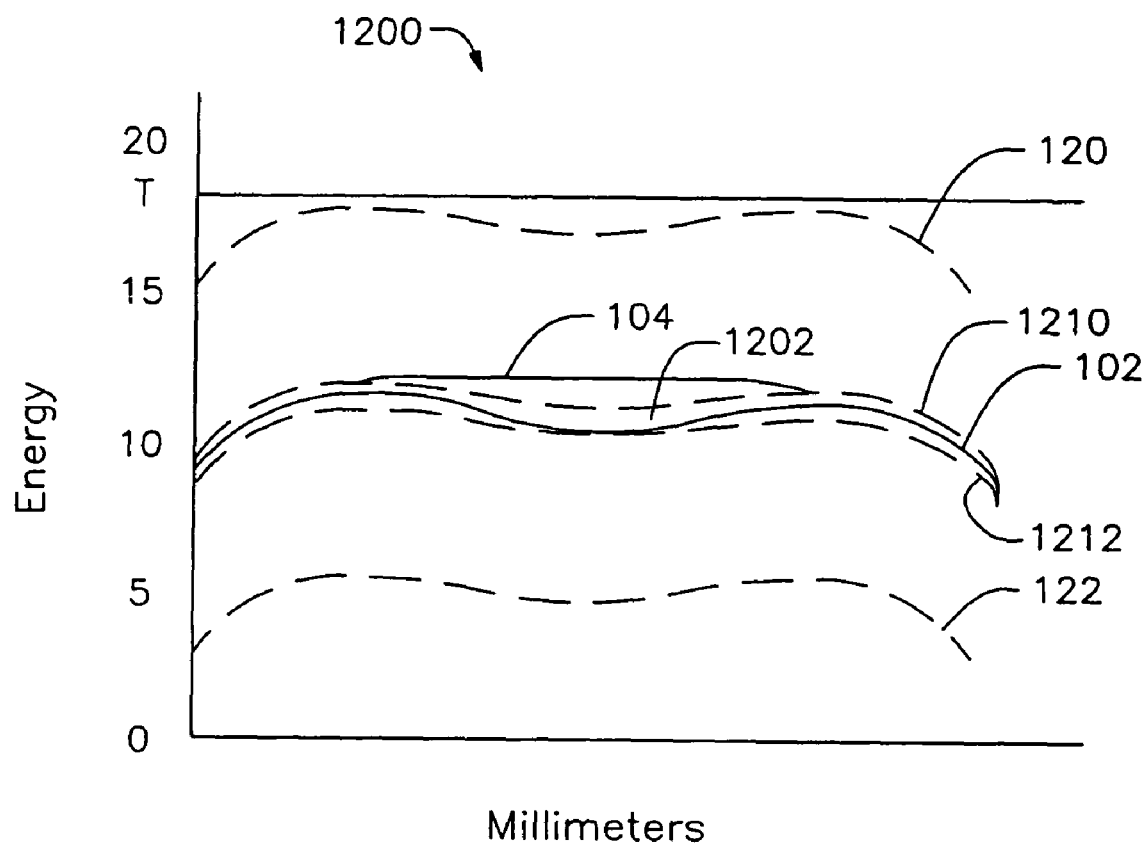
FIG. 12 is a graph of the energy distribution across the transducer in accordance with one embodiment of the present invention.

FIG. 12 is a graph 1200 of the energy distribution across the transducer in accordance with one embodiment of the present invention. In comparison with the prior art energy window shown by curves 120 and 122, an auto-tuning RF generator can result in a much narrower energy window 1202 between curve 1210 and curve 1212. Since the energy window 1202 is much narrower, then the energy window can be shifted upward closer to the energy threshold T of the substrate and thereby provide a more effective acoustic energy cleaning process.

As used herein in connection with the description of the invention, the term "about" means+/−10%. By way of example, the phrase "about 250" indicates a range of between 225 and 275. It will be further appreciated that the instructions represented by the operations in FIGS. 4, 7 and 10 are not required to be performed in the order illustrated, and that all the processing represented by the operations may not be necessary to practice the invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of cleaning a substrate comprising:
applying an RF signal at a frequency f to a transducer, the transducer being oriented toward the substrate such that the transducer emits an acoustic energy at the frequency f toward the substrate, wherein the substrate and the transducer are submerged in a cleaning solution;
moving the substrate relative to the transducer; and
dynamically adjusting the RF signal to maintain a resonance of the emitted acoustic energy between the substrate and the transducer.

2. The method of claim 1, wherein dynamically adjusting frequency f includes automatically adjusting the frequency f for each cycle of the RF signal.

3. The method of claim 1, wherein moving the substrate relative to the transducer includes rotating the substrate.

4. The method of claim 1, wherein dynamically adjusting the RF signal to maintain a resonance of the emitted acoustic energy between the substrate and the transducer includes detecting a reflected signal corresponding to energy reflected into the transducer external from the transducer.

5. The method of claim 1, wherein the cleaning solution is deionized water.

6. The method of claim 1, wherein the cleaning solution includes one or more of a plurality of cleaning chemicals.

7. The method of claim 1, wherein dynamically adjusting the RF signal to maintain the resonance of the acoustic energy includes dynamically adjusting a frequency f of the RF signal applied to the transducer.

8. The method of claim 1, wherein moving the substrate relative to the transducer includes moving the substrate a variable distance d relative to the transducer.

9. The method of claim 8, wherein the distance d varies about ½ wavelength of the frequency f of the RF signal.

10. The method of claim 1, further comprising coupling a feedback signal to an input of the transducer and wherein the feedback signal includes a reflected signal corresponding to energy reflected into the transducer external from the transducer.

11. The method of claim 1, wherein the transducer includes two or more transducers.

* * * * *